United States Patent [19]

Kodato

[11] Patent Number: 4,835,059

[45] Date of Patent: May 30, 1989

[54] THIN FILM CONDUCTOR WHICH CONTAINS SILICON AND GERMANIUM AS MAJOR COMPONENTS AND METHOD OF MANUFACTURING THE SAME

[75] Inventor: Setsuo Kodato, Atsugi, Japan

[73] Assignee: Anritsu Corporation, Tokyo, Japan

[21] Appl. No.: 896,131

[22] Filed: Aug. 12, 1986

[30] Foreign Application Priority Data

Aug. 26, 1985 [JP] Japan ................................ 60-186900

[51] Int. Cl.⁴ ..................... B32B 15/00; H01L 27/12; G01L 1/22
[52] U.S. Cl. .................................... 428/432; 136/258; 338/2; 357/4; 428/446; 428/450; 428/699; 428/701; 428/702
[58] Field of Search ................. 136/258 PC, 258 AM; 420/556, 578; 148/DIG. 1, DIG. 58, DIG. 152, DIG. 122, DIG. 59; 428/428, 446, 704, 432, 450, 701, 702, 699; 357/30 J, 30 K, 30 N, 4

[56] References Cited

U.S. PATENT DOCUMENTS

| | | | |
|---|---|---|---|
| 3,771,026 | 11/1973 | Asai et al. | 148/DIG. 1 |
| 4,344,984 | 8/1982 | Kaplan et al. | |
| 4,398,343 | 8/1983 | Yamazaki | 136/258 PC |
| 4,409,134 | 10/1983 | Yamazaki | 136/258 PC |
| 4,435,445 | 3/1984 | Allred et al. | |
| 4,498,092 | 2/1985 | Yamazaki | 136/258 PC |
| 4,609,771 | 9/1986 | Guha et al. | 357/59 D |

FOREIGN PATENT DOCUMENTS

| | | |
|---|---|---|
| 042773 | 12/1981 | European Pat. Off. . |
| 061388 | 9/1982 | European Pat. Off. . |
| 0161556 | 11/1985 | European Pat. Off. ...... 148/DIG. 1 |
| 2390004 | 1/1979 | France . |
| 0033041 | 3/1979 | Japan . |
| 0015561 | 1/1980 | Japan . |
| 0210826 | 10/1985 | Japan ........................... 136/258 PC |
| 2038086 | 7/1980 | United Kingdom . |
| 2086135 | 5/1982 | United Kingdom . |

OTHER PUBLICATIONS

Metal-Nonmetal Transition in Amorphous Si-Au System at Low Temperatures: Measurements of Electrical Conductivity and Thermoelectric Power, vol. 46, No. 3, pp. 846-854, Mar. 1979.

Primary Examiner—George F. Lesmes
Assistant Examiner—James B. Monroe
Attorney, Agent, or Firm—Frishauf, Holtz, Goodman & Woodward

[57] ABSTRACT

The invention relates to a thin film conductor which has a composition containing silicon and germanium as major components and has a structure in which both amorphous and microcrystalline phases are present, and a method of manufacturing the same by a CVD method. The resultant thin film conductor has characteristics, such as a high dark conductivity, a large gauge factor, a small temperature coefficient of the dark conductivity, a large thermoelectric power, and the like, and is used as a material for microelectronic devices having a sensor function.

11 Claims, 7 Drawing Sheets

THIN FILM CONDUCTOR WHICH CONTAINS SILICON AND GERMANIUM AS MAJOR COMPONENTS AND METHOD OF MANUFACTURING THE SAME

BACKGROUND OF THE INVENTION

1. Field of the Invention

The present invention relates to a thin film conductor which contains silicon and germanium as major components and is used as a material for an electronic circuit, more specifically, microelectronic devices functioning as sensors, and a method of manufacturing the same.

2. Description of the Prior Art

As an electron material for microelectronic devices having a sensor function, various metals, alloys, element semiconductors, compound semiconductors and submetallic or amorphous substances are known. Among these materials, semiconductors are known to have a large thermoelectric power (i.e., a high Seebeck coefficient) or a high gauge factor based on a piezo resistance effect but to have a low electrical conductivity as well as a large temperature coefficient (a changing rate of the electrical conductivity, the Seebeck coefficient, or the gauge factor upon change in temperature). In contrast to this, metal-based materials are known to have a high electrical conductivity, a small temperature coefficient, and a small thermoelectric power or gauge factor.

For example, p-type silicon as a semiconductor element has a large gauge factor $10^2$ times larger than that of a nickel-chromium alloy but has a large temperature coefficient of electrical resistance $10^3$ times larger than that of the alloy.

When these known conventional materials are used as a material of a sensor, e.g., a power sensor for measuring electrical power or a strain gauge sensor, this results in poor performance.

SUMMARY OF THE INVENTION

It is a first object of the present invention to provide a thin film conductor which has both the advantages of a semiconductor, i.e., a large thermoelectric power and a high piezo resistance effect, and those of a metal, i.e., a high electrical conductivity and a small temperature coefficient.

It is a second object of the present invention to provide a method of manufacturing a thin film conductor wherein a thin film conductor having the above advantages can be deposited on an insulating substrate of a desired material to have a desired size and planar shape.

In order to achieve the first object of the present invention, the thin film conductor has a composition containing silicon and germanium as major components and has a structure in which both amorphous and microcrystalline phases are present.

In order to achieve the second object of the present invention, the thin film conductor is manufactured by a so-called plasma CVD method or a photo-excited CVD method.

DESCRIPTION OF THE PREFERRED EMBODIMENT

In the specification and claims of the present invention, a "thin film conductor having a structure in which both amorphous and microcrystalline phases are present" is composed of a material excluding liquids and gases, and is a conductor which exhibits no three-dimensional periodicity from the viewpoint of the crystallography, i.e., is an irregular amorphous conductor, which includes a microcrystalline phase which has a size of 5 to 50 nm and can be determined by an X-ray diffraction pattern. The X-ray diffraction pattern of the structure in which both the amorphous and microcrystalline phases are present includes a sharp diffraction curve due to the presence of the microcrystalline phase and a broad diffraction curve due to the presence of the amorphous phase. When the X-ray diffraction pattern of this thin film was examined using a 0.1541 nm Cu-K$\alpha$ line of incident X-rays, diffraction angles (2$\theta$) of 28°, 46.3°, and 54.8° corresponded to (111), (220), and (311) planes of Si-Ge eutetic, and the sharp diffraction curves are observed at these diffraction angles. The diffraction angles differ in accordance with composition ratio of Si-Ge. When Si is rich, these diffraction angles are approximated to 28.4°, 47.3°, and 56.1°. When Ge is rich, these angles are approximated to 27.3°, 45.3°, and 53.7°.

A thin film conductor of the present invention has a composition containing Si and Ge as major components, and a structure in which both the amorphous and microcrystalline phases are present. Although this thin film conductor has a semiconductor composition, it has properties of a metal, i.e., a high electrical conductivity, a small temperature coefficient, and a large piezo resistance (elast resistance) effect in addition to a feature of a semiconductor, i.e., a large Seebeck effect. This was found by the present inventor.

The thin film conductor is composed of Ge-Ge, Si-Ge, and Si-Si bonds. The composition ratio of Si and Ge in the thin film conductor is Si/Ge=100 wt % or lower (except for zero), more preferably, 0.5 to 2 wt %. The crystallinity of the thin film tends to decrease as the content of Ge decreases. Conversely, the crystallinity of the thin film increases as the content of Ge increases.

The thin film conductor used as a p-type conductor contains boron added as a dopant, and the thin film conductor as a n-type conductor contains, phosphorus or arsenic added as a dopant.

The thin film conductor preferably has a structure of 10% to 90% of microcrytalline phase and the balance of amorphous phase, and more preferably, 30 to 90% of microcrystalline phase and the balance of amorphous phase.

The thin film of the present invention has an electrical conductivity of at least 1 S·cm$^{-1}$ and a temperature coefficient of electrical conductivity of 1%/K or less. In addition, the conductor has a thermoelectric power (Seebeck coefficient) of at least 10 $\mu$V/K, and a gauge factor (changing rate of a resistance/strain; indicating a piezo resistance effect or elast resistance effect) of at least 4.

The thin film is normally formed on an insulating substrate, and comprises a pair of electrodes for input-/output current at two ends thereof to provide a structure which can utilize electrical characteristics inherent thereto as a sensor. As the insulating substrate, various insulating materials, such as a glass substrate, mica, a polyimide film, a metal plate covered with an insulating thin film, and the like can be used. Preferably, a silicon oxide thin film and an aluminum oxide thin film are useful for covering the metal plate, sequentially deposited on a glass substrate by an ion-plating method. A multilayered thin film consisting of the silicon oxide thin film and the aluminum oxide thin film is not corroded by a hydrofluoric acid-containing solution mixture as an etching solution of the thin film conductor of the present invention. For this reason, when the thin film conductor of the present invention is pattern-etched, the surface of the glass substrate can be prevented from being corroded and a pattern edge portion can be protected from formation of a deep groove.

Methods of depositing a thin film conductor on an insulating substrate include a plasma CVD method, a photo-excited CVD method, and the like. Upon use of the plasma CVD method, the insulating substrate is stored in a vacuum chamber and is held at a predetermined temperature preferably falling within the range of 300° to 500° C. Next, a gas mixture containing silane and germane is supplied to the vacuum chamber at a predetermined flow rate ratio, preferably SiH$_4$./GeH$_4$=100 or lower (except for zero), while maintaining the vacuum chamber at a predetermined pressure, preferably 0.5 to 10 Torr. When a p-type conductor is to be formed, for example, hydrogen-diluted diborane (B$_2$H$_6$) is added to the gas mixture. When an n-type conductor is to be formed, hydrogen-diluted phosphine (PH$_3$) or arsine (AsH$_3$) are added to the gas mixture. Then, plasma discharge is performed between a pair of electrodes arranged in the vacuum chamber while flowing the gas mixture. The power density of plasma discharge preferably falls within the range of 0.1 to 10 W/cm$^2$. With the plasma discharge, silane (SiH$_4$) and germane (GeH$_4$) chemically react as follows, and Si and Ge are deposited on the insulating substrate.

SiH$_4$→SiH$_3$*+H*

SiH$_3$*→SiH$_2$**+H*

SiH$_2$→SiH*+H*

GeH$_4$→GeH$_3$*+H*

GeH$_3$*→GeH$_2$**+H*

GeH$_2$→GeH*+H*

(In the above formulas, the molecules or atoms indicated by mark * are activated.) B$_2$H$_6$, PH$_3$, and AsH$_3$ chemically react in the same manner as above. In the method of the present invention, since the composition ratio of the thin film conductor changes in proportion to the gas flow rate ratio, the composition of the thin film conductor is controlled by adjusting the gas flow rate ratio. Since increase of the discharge power density increases the crystallinity of the thin film conductor, an adjustment of the discharge power density controls the structure of the thin film conductor. When a thin film conductor is deposited on an insulating substrate by a photo-excited CVD method, ultraviolet rays having decomposition energy for silane (SiH$_4$) and germane (GeH$_4$), e.g., 185-nm ultraviolet rays, are radiated to excite the above chemical reaction while flowing the gas mixture inside the vacuum chamber. With the photo-excited CVD method, the temperature of the insulating substrate can be lower (e.g., 200° C.) than that in the plasma CVD method. Other conditions are almost same as those of the plasma CVD method.

When the insulating substrate is maintained at a temperature of about 900° C., an Si-Ge alloy thin film conductor can be deposited on the insulating substrate by simply supplying the gas mixture without using the photo-excited CVD method or the plasma CVD method.

(1) According to the thin film conductor prepared by the method of the present invention, since it has a high dark conductivity of 1 S·cm$^{-1}$ (maximum value: 700 S·cm$^{-1}$), a small-sized resistor can be formed on the insulating substrate.

(2) Since the thin film conductor of the present invention has a Seebeck coefficient of 100 to 160 V/K or higher, as well as a dark conductivity of 100 S·cm$^{-1}$ or higher, a high-performance thermospile, power sensor for high-frequency region, infrared detector, temperature sensor, and the like can be realized.

(3) Since the thin film conductor of the present invention has a high gauge factor of 4 to 10 as well as a dark conductivity of 100 S·cm$^{-1}$, a high-performance strain sensor, pressure sensor, load cell, touch sensor, and the like can be realized.

(4) Since the thin film conductor of the present invention has an extremely small temperature coefficient of the dark conductivity of 1%/K, a resistor, high-frequency power sensor, infrared detector, strain sensor, pressure sensor, load cell, and the like without requiring temperature compensation can be realized.

(5) With the method of the present invention, the thin film conductor having the above characteristics can be formed by a relatively simple method (e.g., a photo-excited CVD method, a plasma CVD method, and the like). When manufacturing conditions, e.g., a gas flow rate ratio, an atmospheric pressure, a discharge power density, an insulating substrate temperature, and the like, are adjusted, the crystallinity of the thin film conductor or the composition ratio of Si and Ge can be controlled, thus providing a desired dark conductivity and a thermoelectric power of the thin film conductor of the present invention.

(6) Since the method of the present invention can be carried out at the same time of an IC manufacturing process, a temperature sensor, a strain gauge, a pressure sensor, and the like can be easily assembled in conventional ICs. As a result, a high-performance IC can be obtained. Since the thin film conductor is formed in a low temperature process by the CVD method, a temperature sensor, a strain gauge, and the like can be combined in the form of three-dimension.

(7) Since the thin film conductor is formed by the CVD method, a conductor having a desired shape and size can be formed on an arbitrary plane of the insulating substrate.

The present invention will be described in more detail with reference to the accompanying drawings.

Figure 8:
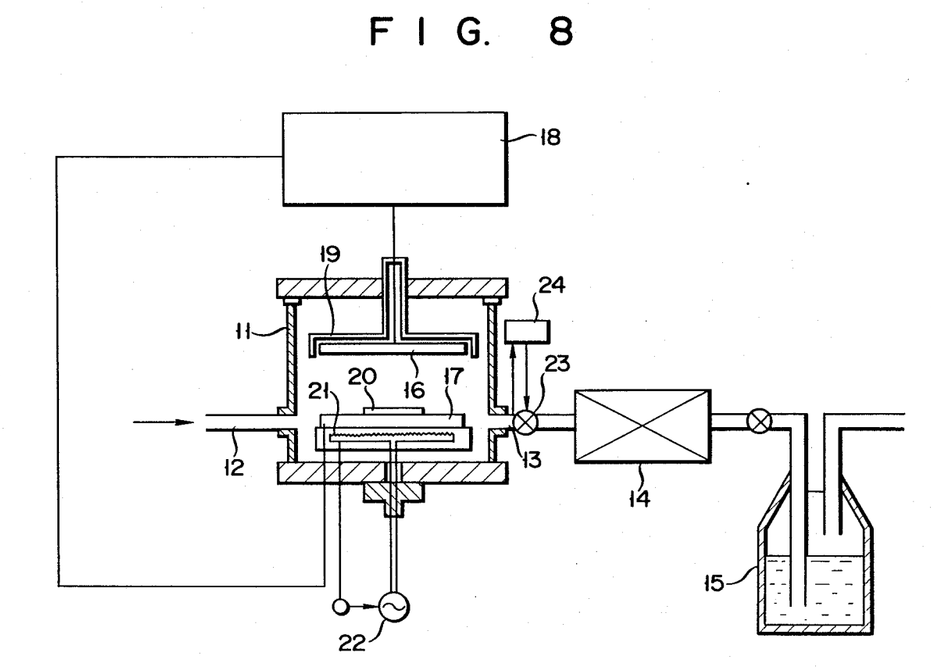
FIG. 8 is a schematic diagram of an apparatus for manufacturing a thin film conductor of the present invention.

FIG. 8 shows an apparatus for manufacturing a p-type thin film conductor by a CVD (Chemical Vapor Deposition) method. In this apparatus, gas-mixture supply port 12 and exhaust port 13 are formed in vacuum chamber 11. Exhaust port 13 is connected to exhaust pump 14, and device 15 for removing a toxic gas contained in an exhausted gas is connected to the outlet port of exhaust pump 14. Disk-like electrodes 16 and 17 are arranged in upper and lower portions of vacuum chamber 11, and a high-frequency voltage is applied therebetween by high-frequency power source 18. The upper and side surfaces of upper electrode 16 are covered with stainless-steel cover 19. Insulating substrate 20 for depositing a thin film thereon is placed on the upper surface of lower electrode 17. A heater 2 is arranged inside lower electrode 17 to perform substrate 20 to heated. In this case, a heating temperature is controlled to be a predetermined temperature by temperature controller 22. Control valve 23 is mounted on exhaust port 13 of vacuum chamber 11, and is operated to evacuate vacuum chamber 11 to a predetermined pressure in response to a detection signal from pressure gauge 24 for detecting the pressure inside chamber 11.

Figure 1:
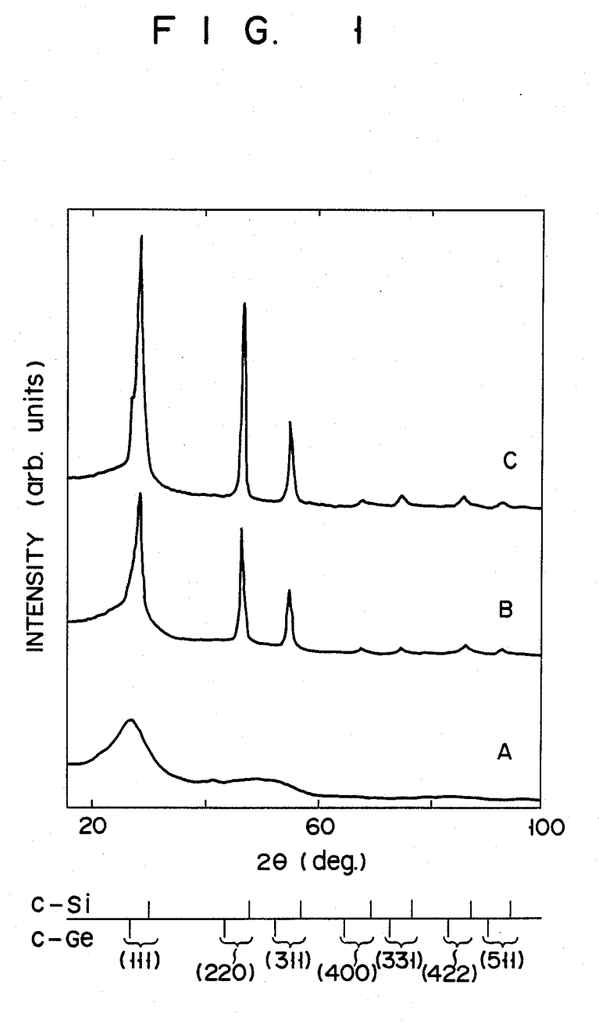
FIG. 1 is a graph showing X-ray diffraction patterns of thin film conductors of the present invention prepared with different power densities of plasma discharge shown in Table 1.

In this case, under deposition conditions A, B, and C shown in Table 1, silane, germane, and a small amount of hydrogen-diluted diborane were supplied to the inside of vacuum chamber 11. A thin film conductor to which silicon, germanium, and a small amount of boron were added, was deposited on glass insulating substrate 20. FIG. 1 shows the measured results of X-ray diffraction patterns of the resultant thin film conductors. In FIG. 1, the abscissa represents diffraction angle $2\theta$, and the ordinate represents a diffraction intensity. In addition, "ref" represents diffraction peak value data of crystal grain samples of silicon and germanium, and A, B, and C correspond to sample symbols A, B, and C in Table 1. As can be seen from FIG. 1, the thin film of sample A is composed only of amorphous phase. The thin films of samples A and B are composed of both the amorphous and the microcrystalline phases. However, as deposition conditions change from B to C, i.e., as the discharge power density increases from 0.11 W/cm$^2$ to 0.40 W/cm$^2$, the sharper peaks appear on the pattern. Therefore, the ratio of the microcrystalline and the amorphous phases in the thin film can be adjusted by adjusting the discharge power density. The ratio of the microcrystalline and the amorphous phases in the thin film can be obtained such that the X-ray diffraction pattern is divided to the amorphous and the microcrystalline patterns, and the areas of predetermined portions of the divided patterns are calculated.

TABLE 1

| | Deposition Condition of Si—Ge Alloy | | | | |
|---|---|---|---|---|---|
| Samples | Gas ratio (SiH$_4$/GeH$_4$) | Total pressure (Torr) | Power (W) | Power density (W/cm$^2$) | Ts (°C.) |
| A | 1 | 2 | 15 | 0.02 | 380 |
| B | 1 | 2 | 80 | 0.11 | 380 |
| C | 1 | 2 | 300 | 0.40 | 380 |

Within the present invention, the ratio of the microcrystalline phase, contained in the thin film, is obtained as follows. It is known that the total scattering intensity of X-rays, more specifically, the intensity of coherent scattering excluding Compton scattering, is always constant even if the ratio of the amorphous and the microcrystalline phases varies. Thus, crystallinity x is obtained from scattering intensity Ia100 of a standard sample composed of 100% amorphous phase and scattering intensity Ia of a sample to be measured in accordance with the following relation:

$$x = (1 - \Sigma Ia/\Sigma Ia100) \times 100$$

Figure 9A:
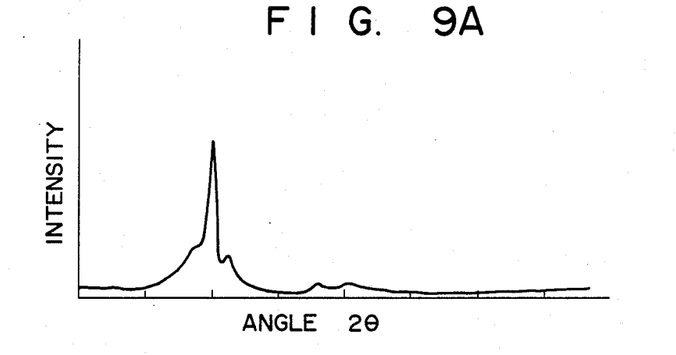
FIGS. 9A to 9C are graphs for sequentially explaining a method for obtaining crystallinity of the thin film conductor of the present invention from the X-ray diffraction patterns.
Figure 9B:
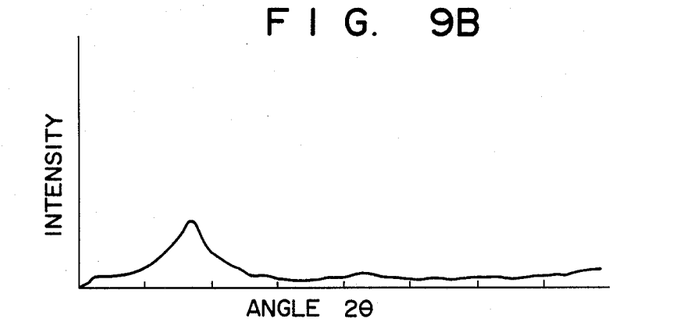
Figure 9C:
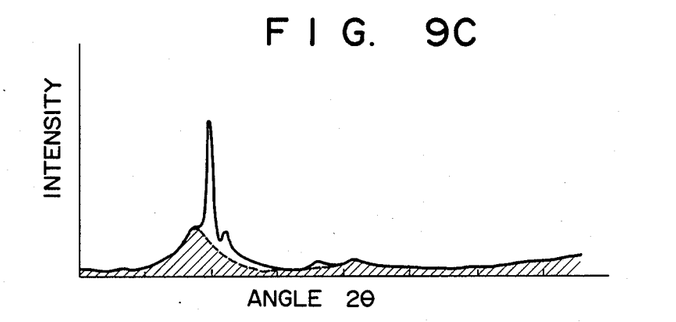

In terms of the profile of the scattering intensity based on the amorphous phase, it was assumed that when the microcrystalline phase content changes, the intensity changes in proportion thereto but the shape of the profile does not change. The scattering intensity based on the amorphous phase was separated from the total scattering intensity, and the scattering intensity of the microcrystalline phase was measured. More specifically, coefficient K, which makes the scattering intensities of the sample to be measured and the standard sample to coincide with each other by the least square method, is obtained from a scattering angle range which is not easily influenced by tailing of the microcrystalline phase peak. Then, the scattering intensity of the standard sample is multiplied with K, and the resultant intensity of the standard sample is subtracted from that of the sample to be measured, thereby separating and measuring the scattering intensity based on the amorphous phase. FIGS. 9A to 9C show the measurement procedures, wherein FIG. 9A shows the scattering intensity of the sample to be measured; FIG. 9B shows the K-multiplied scattering intensity of the standard sample; and FIG. 9C shows the scattering intensity obtained by subtracting the scattering intensity shown in FIG. 9B from that shown in FIG. 9A.

The peaks of the diffraction patterns of thin film samples B and C correspond to diffraction peak values of (111), (220), and (311) of Si and Ge. This shows that these thin films are composed of a mixture of Si and Ge.

Figure 2:
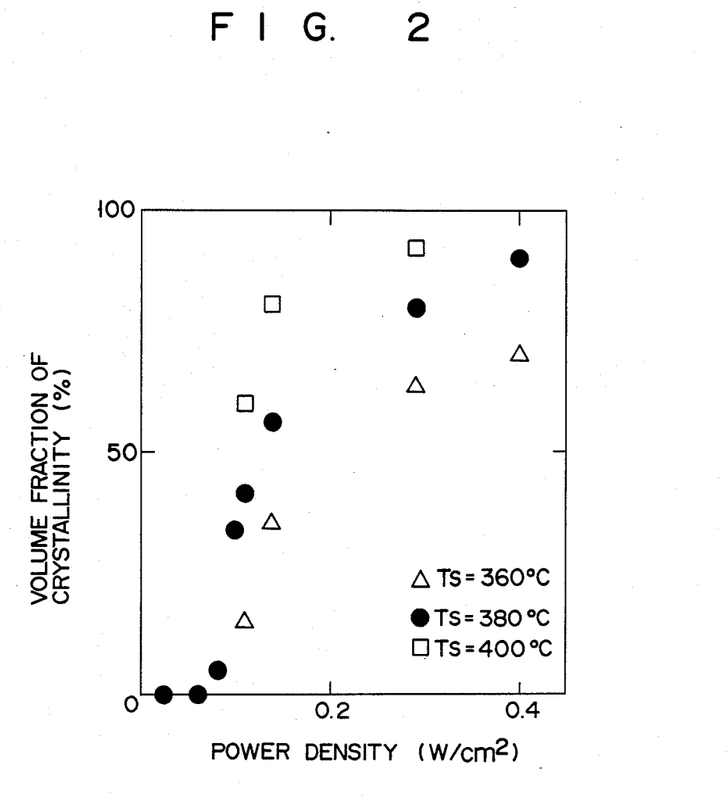
FIG. 2 is a graph showing the relationship between crystallinity of a thin film and a power density of plasma discharge.

FIG. 2 shows the results of an experiment wherein the relationship between the discharge power density and the crystallinity (%) of the thin film (the content of the microcrystal) in the manufacture of the thin film of the present invention was examined based on the X-ray diffraction patterns shown in FIG. 1. As can be seen from FIG. 2, when the discharge power density exceeds 0.1 W/cm$^2$, the crystallinity of the thin film immediately increases.

Figure 3:
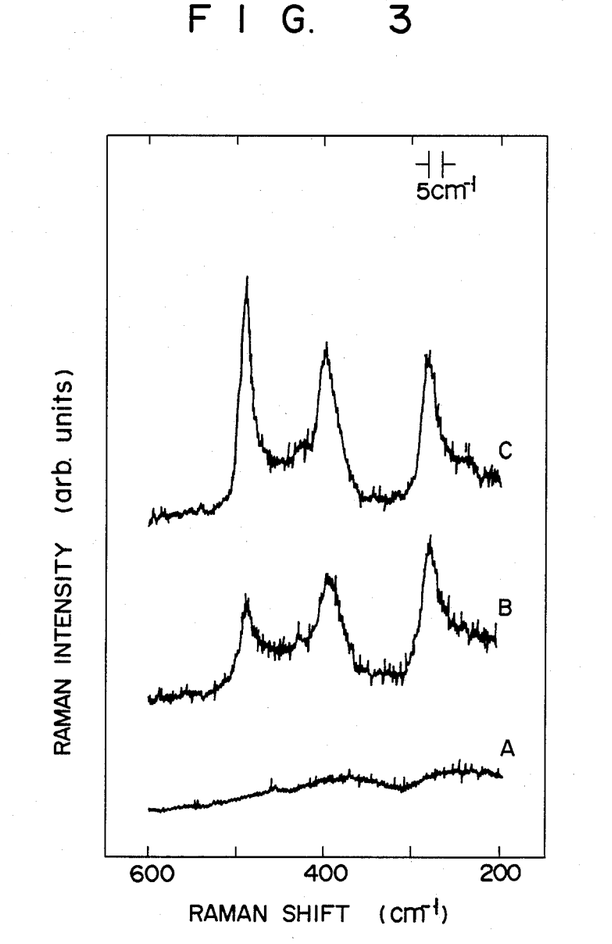
FIG. 3 is a graph showing laser Raman spectra of the thin film conductors of the present invention under the preparation conditions shown in Table 1.

FIG. 3 shows the results of measurement of laser Raman spectra for thin film samples A, B, and C. The sample was measured in a form of an orthogonal scattering method. In FIG. 3, the abscissa represents a Raman shift (cm$^{-1}$) and the ordinate represents a Raman intensity. Referring to FIG. 3, the pattern of sample A is broad, and shows that sample A is composed of the amorphous phase. The patterns of samples B and C are sharp and show that the microcrystalline and amorphous phases are mixed. These results correspond well to those obtained from the X-ray diffraction patterns shown in FIG. 1. As can be seen from FIG. 3, Raman peaks of the patterns of samples B and C are obtained near 290 cm$^{-1}$, 400 cm$^{-1}$, and 490 cm$^{-1}$. This shows that these thin films are composed in a form of Ge-Ge, Si-Ge, and Si-Si bonds. In addition, from the X-ray diffraction patterns shown in FIG. 1 and the Raman spectra shown in FIG. 3, in the thin film of the present invention; the microcrystalline phase consisting only of Si or Ge is not present, but is constituted by an Si-Ge crystal mixture.

Figure 4:
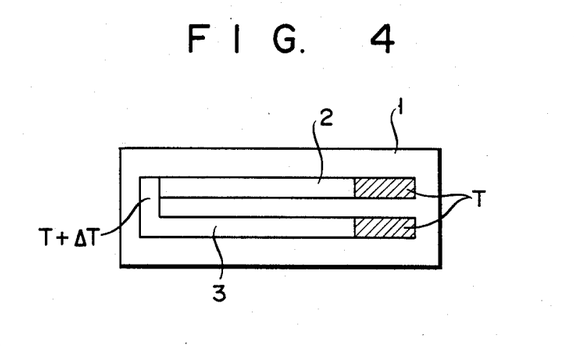
FIG. 4 is an illustration showing an element for measuring a dark conductivity and a Seebeck coefficient of the thin film conductor prepared under the conditions of Table 1.

FIG. 4 shows an element 4 for measuring a dark conductivity and a Seebeck coefficient for the thin films of the present invention formed on the glass substrate under the conditions shown in Table 1. Reference numeral 1 denotes an insulating substrate formed of glass; and 2, a thin film (thickness being about 1 μm) of the present invention, which is patterned by a conventional photolithography technique. With this technique, after a photoresist protection film was formed on the thin film, the resultant structure was dipped in an etching solution as a solution mixture of hydrofluoric acid, nitric acid, and acetic acid (volume ratio of 1:26:33), thereby removing an unnecessary portion of the film. A plasma etching method in atmosphere of $CF_4+O_2$ or $NF_3$ can be also used as an etching method. Reference numeral 3 denotes a platinum thin film which is formed by a vacuum evaporation method. T+ΔT indicates a point of hot junction, and T indicates a point of cold junction.

Figure 5:
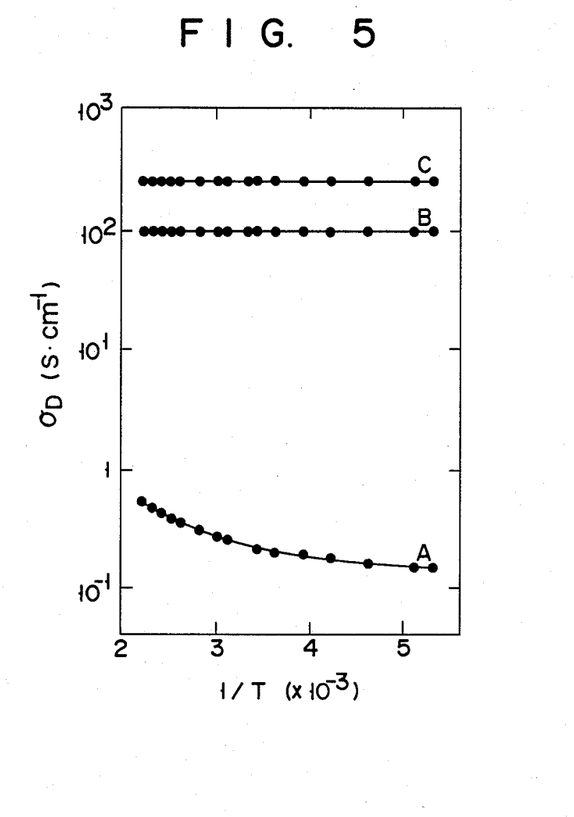
FIG. 5 is a graph showing the temperature characteristics of the dark conductivity of the thin film of the present invention obtained by the measuring element shown in FIG. 4.

FIG. 5 shows the temperature characteristics of dark conductivities of the thin films of the present invention measured using element 4 shown in FIG. 4. In FIG. 5, the abscissa represents a reciprocal of an absolute temperature (1/T), and the ordinate represents a dark conductivity ($\sigma_D$). Each patterns A, B, and C correspond to each sample symbols A, B, and C in Table 1. The pattern of sample A is proportional to $(1/T)^{\frac{1}{4}}$ in a low-temperature range, and is proportional to 1/T in a high-temperature range. This shows that electron transport is dominated by hopping conduction mechanism in the low-temperature range and by band conduction mechanism in the high-temperature range. These characteristics are the same as those of a conventional amorphous silicon film. However, the absolute value of the dark conductivity can be improved to ten to hundred times that of the conventional film. The dark conductivity of samples B and C respectively containing 30% and 90% of the microcrystalline phase is 100 S·cm$^{-1}$ and is substantially equal to that of a submetallic substance. In addition, samples B and C have an extremely small temperature coefficient of less than 1%/K. Since the dark conductivity is not easily influenced by temperature, the thin films of samples B and C are very effective to form a small resistor on an IC chip. Although not shown, it was confirmed that, of the thin films prepared by the present inventor, when a sample had a dark conductivity exceeding 1 S·cm$^{-1}$, its temperature coefficient was as small as 1%/K or less.

Figure 6:
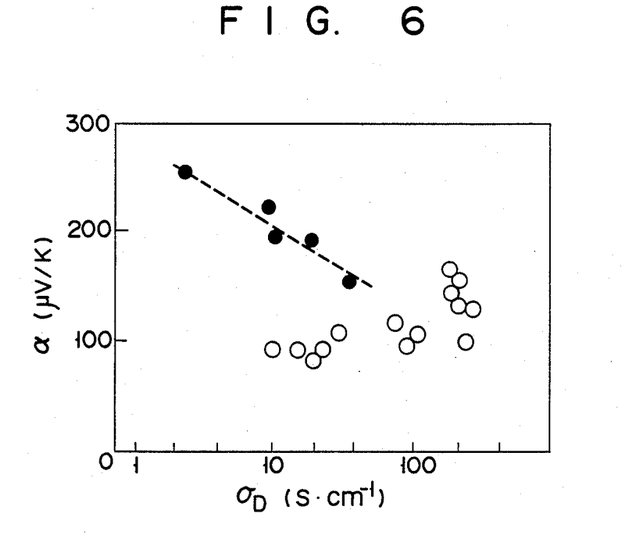
FIG. 6 is a graph showing the relationship between the dark conductivity and the Seebeck coefficient of the thin film of the present invention measured using the element shown in FIG. 4.

FIG. 6 shows dark conductivity-Seebeck coefficient characteristics of the thin films of the present invention measured using element 4 shown in FIG. 4. In FIG. 6, the abscissa represents dark conductivity $\sigma_D$(S·cm$^{-1}$, and the ordinate represents Seebeck coefficient α(μV/K). A ○ mark indicates the dark conductivity and the Seebeck coefficient of the thin film of the present invention, and a ● mark indicates those of a conventional amorphous silicon film. The thin films of the present invention having dark conductivity $\alpha_D$ of 100 S·cm$^{-1}$ or higher has a large Seebeck coefficient of 100 to 160 (μV/K). When the dark conductivity of the amorphous silicon film increases, the Seebeck coefficient thereof tends to decrease. The above values of the present invention are assumed to be ten times or more those of the amorphous silicon film having the same conductivity. Therefore, when the thin film of the present invention having a large Seebeck coefficient and dark conductivity is used, various sensors, e.g., a high-performance thermopile, power sensor for the high-frequency region, infrared detector, temperature sensor, and the like can be realized, and a wide range of application to sensors can be expected.

Figure 7:
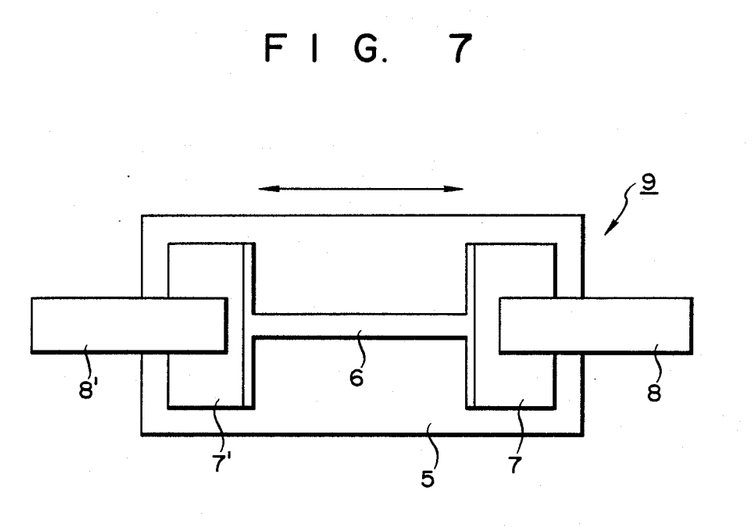
FIG. 7 is an illustration of a strain gauge for measuring gauge factor, comprising the thin film conductors prepared under the conditions of Table 1.

FIG. 7 shows strain gauge element 9. Reference numeral 5 denotes a glass substrate; 6, a thin film of the present invention; 7 and 7', ohmic electrodes comprising nichromium-gold multilayered thin films; and 8 and 8', Au ribbon wires. Arrows in FIG. 7 show directions of an external force applied for strain gauge measurement. When a gauge factor was measured using element 9, a gauge factor of 4 to 10 or higher can be obtained.

What is claimed is:

1. A thin film conductor having a composition containing silicon and germanium as major components and a structure in which both amorphous and microcrystalline phases are present, wherein said thin film comprises germanium-germanium, silicon-germanium and silicon-silicon bonds in said phases and has a dark conductivity of at least 10 S·cm$^{-1}$, a thermoelectric power of at least 10 μV/K, and a temperature coefficient of electrical conductivity of not more than 1%/K whereby said thin film is suitable for use as ohmic electrode material of a semiconductor device, for use as thin film resistor material and likewise for use as a thermoelectric couple.

2. A thin film conductor according to claim 1, wherein said thin film contains not more than 100 parts by weight (excluding zero) of silicon with respect to 1 part by weight of germanium.

3. A thin film conductor according to claim 1, wherein said thin film has a dark conductivity of not less than 100 S·cm$^{-1}$ and a thermoelectric power of not less than 100 μV/K.

4. A thin film conductor according to claim 1, wherein 10 to 90% of microcrystalline phase is contained in said thin film and has an average grain size of 5 to 50 nm.

5. A thin film conductor according to claim 1, wherein 30 to 90% of microcrystalline phase is contained in said thin film, and has an average grain size of 5 to 50 nm.

6. A thin film conductor according to claim 1, wherein said thin film is supported on an insulating substrate, and a pair of electrodes spaced apart on said film are provided for making electrical connections thereto.

7. A thin film conductor according to claim 6, wherein said insulating substrate comprises a silicon oxide thin film superposed on an aluminum oxide thin film which is located on a supporting glass substrate.

8. A thin film conductor according to claim 1, wherein said thin film has a dark conductivity of not less than 100 S·cm$^{-1}$ and a gauge ratio of 4 to 10.

9. A thin film conductor having a composition containing silicon and germanium as major components and a structure in which both amorphous and microcrystalline phases are present wherein said thin film comprises germanium-germanium, silicon-germanium and silicon-silicon bonds in said phases, has a dark conductivity of at least 10 S·cm$^{-1}$, has a gauge factor of at least 4 and a temperature coefficient of electrical conductivity of not more than 1%/K, whereby said thin film is suitable for use as a strain gauge material.

10. A thin film conductor according to claim 9, wherein said thin film has a dark conductivity of not less than 100 S·cm$^{-1}$ and a gauge factor in the range from 4 to 10.

11. A thin film conductor having a composition containing silicon and germanium as major components and a structure in which both amorphous and microcrystalline phases are present, wherein said thin film comprises germanium-germanium, silicon-germanium and silicon-silicon bonds in said phases, has a dark conductivity of at least 10 S·cm$^{-1}$, has a gauge factor of at least 4 and a temperature coefficient of electrical conductivity of not more than 1%/K, and a thermoelectric power of at least 10 μV/K.

* * * * *